United States Patent [19]

Shoji et al.

[11] Patent Number: 5,153,684
[45] Date of Patent: Oct. 6, 1992

[54] NONVOLATILE SEMICONDUCTOR MEMORY DEVICE WITH OFFSET TRANSISTOR

[75] Inventors: Atsushi Shoji, Yokohama; Masamichi Asano; Tadashi Miyakawa, both of Tokyo; Tadayuki Taura, Kawasaki; Michiharu Inami, Tama, all of Japan

[73] Assignee: Kabushiki Kaisha Toshiba, Kawasaki, Japan

[21] Appl. No.: 734,109

[22] Filed: Jul. 24, 1991

Related U.S. Application Data

[63] Continuation of Ser. No. 423,023, Oct. 17, 1989, abandoned.

[30] Foreign Application Priority Data

Oct. 19, 1988 [JP] Japan .................. 63-263166

[51] Int. Cl.⁵ .................. G11C 11/40; H01L 27/115
[52] U.S. Cl. .................. 357/23.5
[58] Field of Search .................. 357/23.5; 365/184, 185

[56] References Cited

U.S. PATENT DOCUMENTS

| | | | |
|---|---|---|---|
| 4,462,090 | 7/1984 | Iizuka | 357/23.5 |
| 4,486,859 | 12/1984 | Hoffmann | 357/23.5 |
| 4,597,060 | 6/1986 | Mitchell et al. | 357/23.5 |
| 4,639,893 | 1/1987 | Eitan | 365/185 |
| 4,642,673 | 2/1987 | Miyamoto | 357/23.5 |
| 4,754,320 | 6/1988 | Mitzutani et al. | 357/23.5 |
| 4,833,514 | 5/1989 | Esquivel et al. | 357/23.5 |
| 4,835,740 | 5/1989 | Sato | 357/23.5 |
| 4,868,619 | 9/1989 | Mukherjee et al. | 357/23.5 |
| 4,905,062 | 2/1990 | Esquivel et al. | 357/23.5 |

FOREIGN PATENT DOCUMENTS

| | | | |
|---|---|---|---|
| 52-058489 | 5/1977 | Japan | 357/23.5 |
| 58-209165 | 12/1983 | Japan | 357/23.5 |
| 60-147165 | 8/1985 | Japan | 357/23.5 |

Primary Examiner—William D. Larkins
Attorney, Agent, or Firm—Finnegan, Henderson, Farabow, Garrett and Dunner

[57] ABSTRACT

Source and drain regions of a second conductivity type are formed in a stripe form in the surface area of a semiconductor substrate of a first conductivity type. A first insulation film is formed on the source and drain regions of the substrate. A second thin insulation film having a tunnel effect is formed on that part of the substrate which lies between the source and drain regions. A floating gate is formed on the second insulation film. A third insulation film is formed on the first insulation film, the floating gate and that part of the substrate which lies between the source and drain regions and on which the second insulation film is not formed. A control gate is formed on the third insulation film in a stripe form extending in a direction which intersects the source and drain regions. An impurity region of the first conductivity type having an impurity concentration higher than the substrate is formed in the substrate except the source and drain regions and the portions lying below the control gate. A floating gate transistor is constituted to include the substrate, source and drain regions, second insulation film, floating gate, third insulation film and control gate. An offset transistor is constituted to include the substrate, source and drain regions, third insulation film and control gate. The first insulation film and the impurity region are used as an element isolation region of a memory cell.

5 Claims, 12 Drawing Sheets

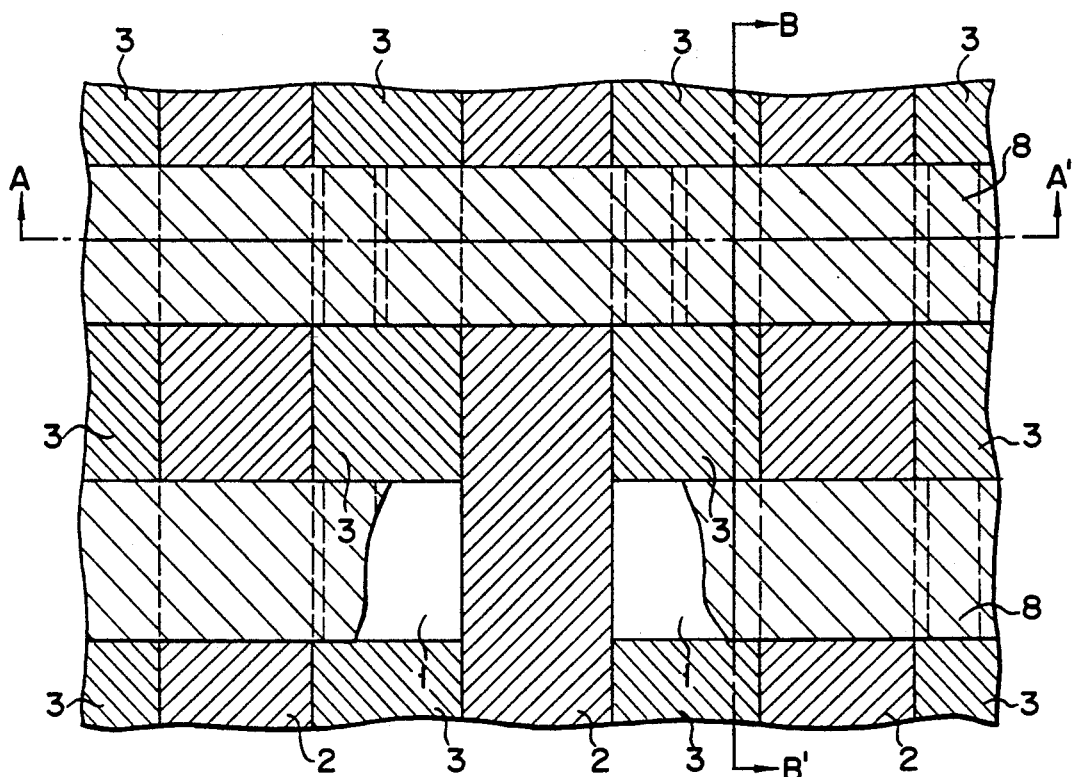
F I G. 5
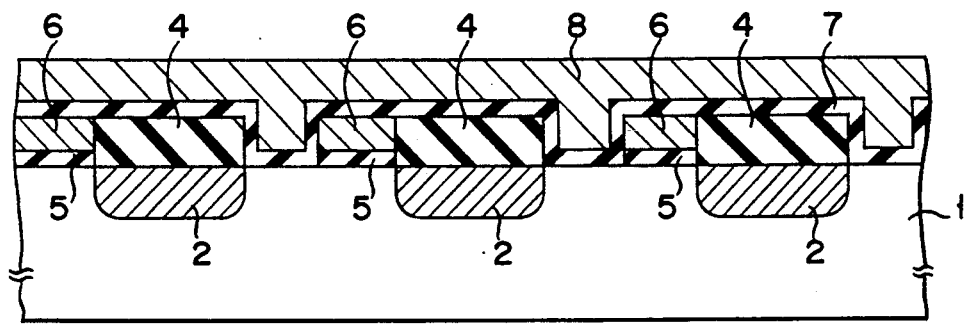
F I G. 6
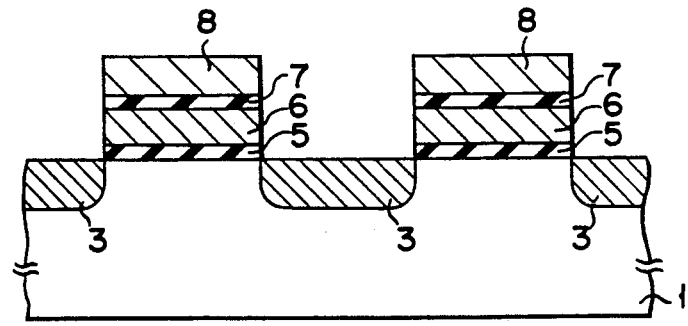
F I G. 7

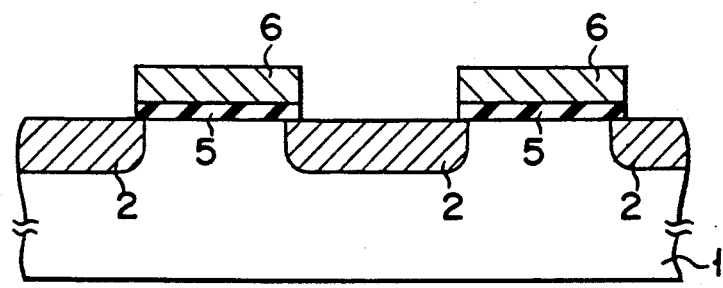
F I G. 8A
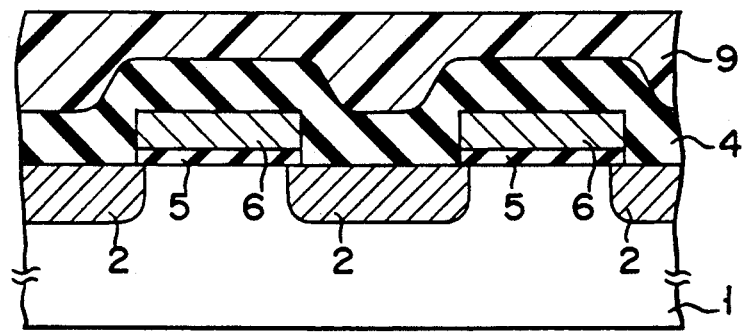
F I G. 8B
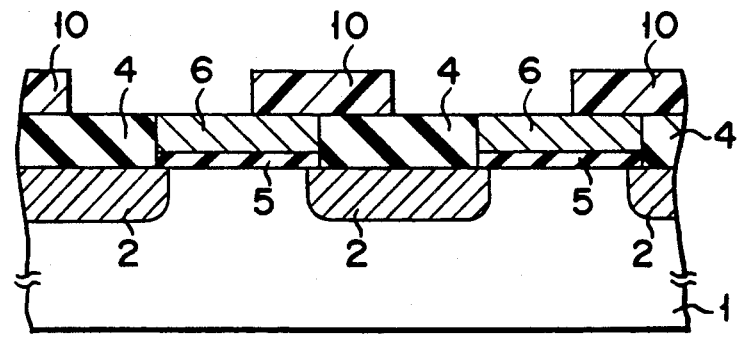
F I G. 8C

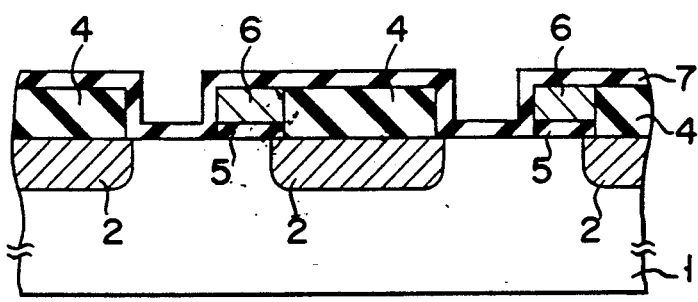
F I G. 8D
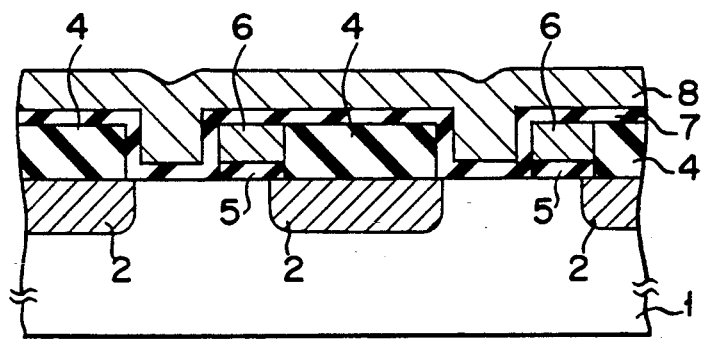
F I G. 8E
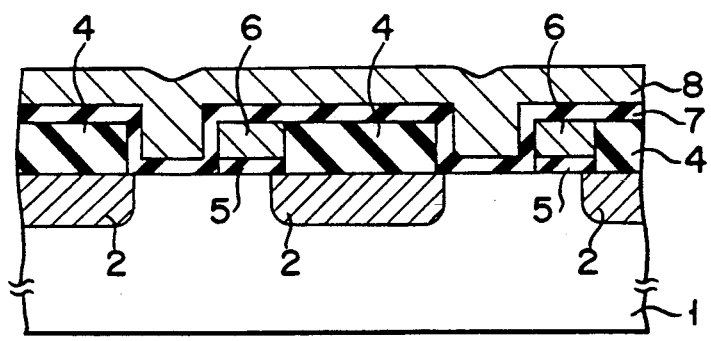
F I G. 8F
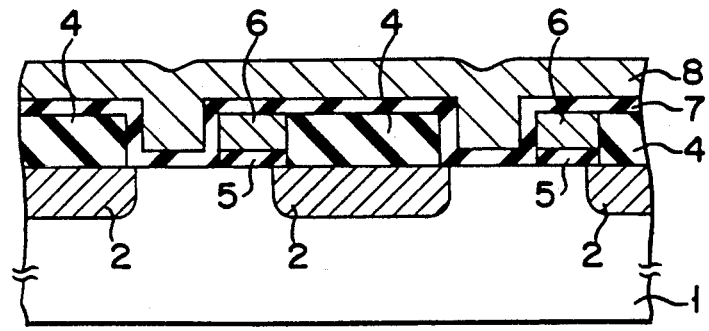
F I G. 8G

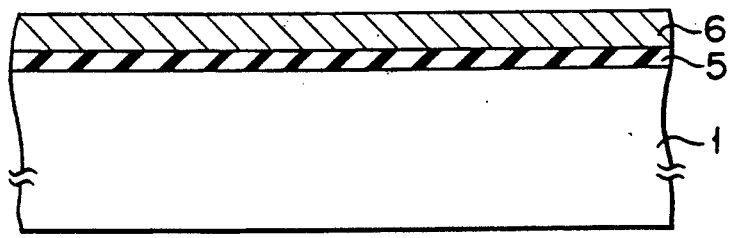
F I G. 9A
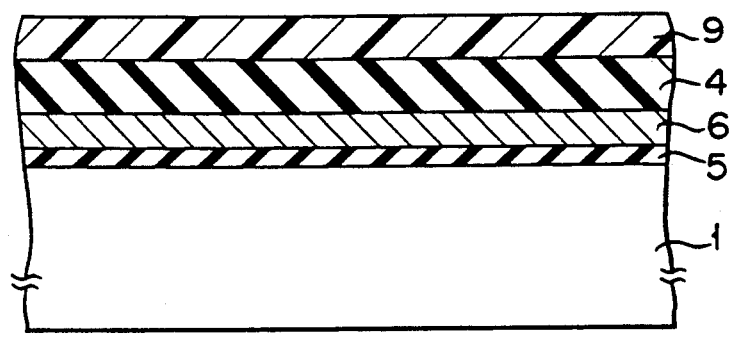
F I G. 9B
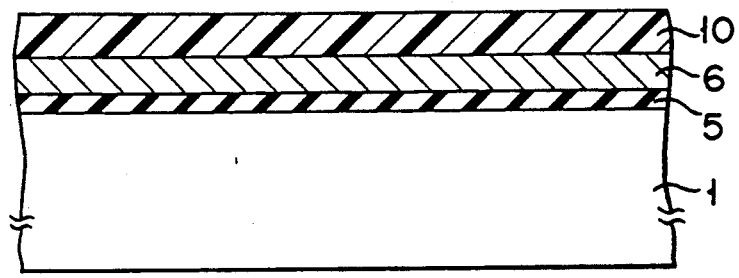
F I G. 9C

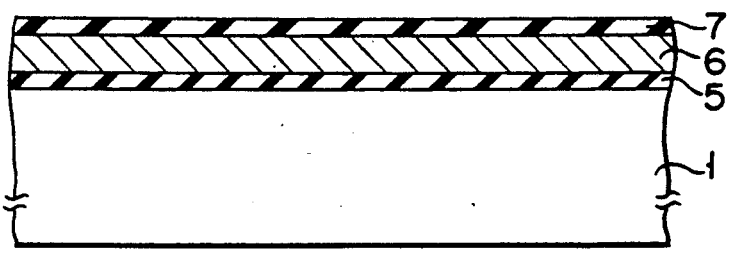
F I G. 9D
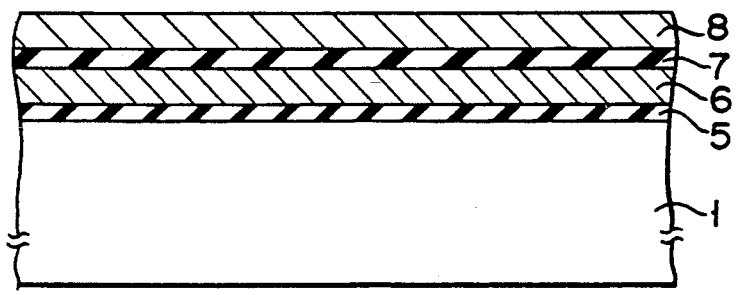
F I G. 9E
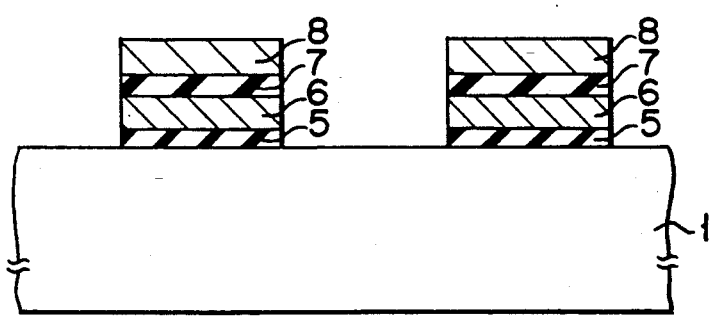
F I G. 9F
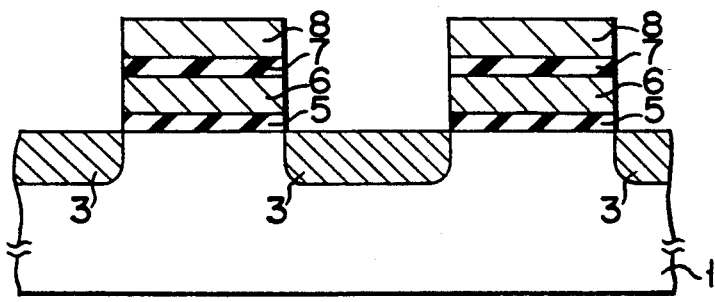
F I G. 9G

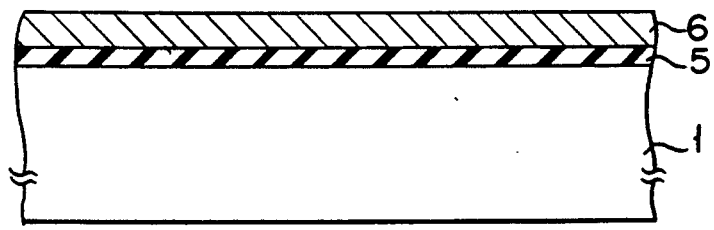
F I G. 14A
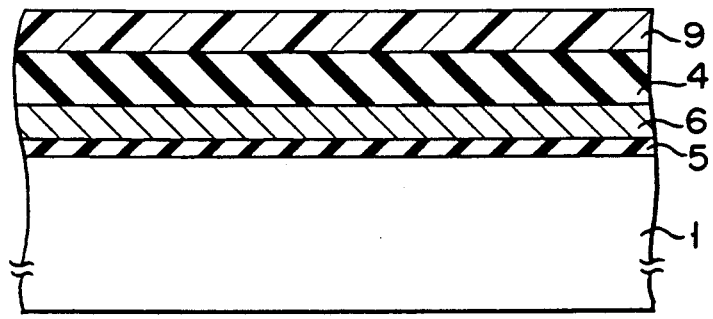
F I G. 14B
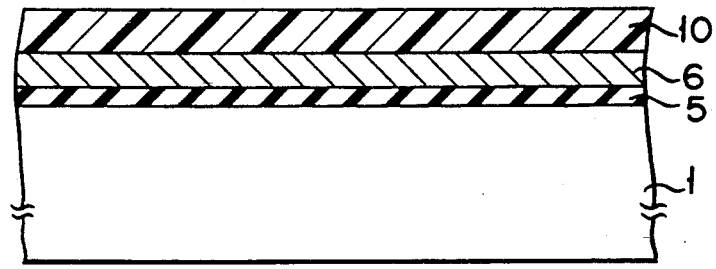
F I G. 14C
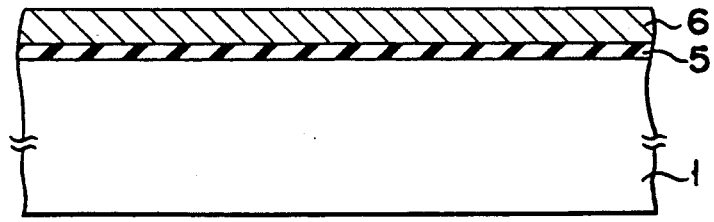
F I G. 14D

NONVOLATILE SEMICONDUCTOR MEMORY DEVICE WITH OFFSET TRANSISTOR

This application is a continuation of application Ser. No. 07/423,023, filed Oct. 17, 1989, now abandoned.

BACKGROUND OF THE INVENTION

1. Field of the Invention

This invention relates to an erasable and programmable nonvolatile semiconductor memory device, and more particularly to a nonvolatile semiconductor memory device having offset transistors and a method for manufacturing the same.

2. Description of the Related Art

Conventionally, a transistor used as an EPROM memory cell is constructed as shown in FIG. 1, for example. That is, n-type source and drain regions 102, which are separated by a preset distance from each other, are formed in the main surface area of a p-type semiconductor substrate 101. A laminated structure of a first insulation film 103, a floating gate 104 of a first polysilicon layer, a second insulation film 105 and a control gate 106 formed of a second polysilicon layer is disposed on that portion of the substrate 101 which lies between the source and drain regions 102.

In a transistor (memory cell) with the above laminated gate structure, the threshold voltage thereof varies according to whether or not electrons are stored in the floating gate 104. For convenience, the transistor constituted to include the floating gate and the control gate is hereinafter referred to as a floating gate transistor. Memory data is read out from the memory cell according to a difference in the threshold voltages. For example, when a word line is selected by a row decoder, a voltage of 5 V is applied to the control gate of the floating gate transistor connected to the selected word line. At this time, whether the floating gate transistor is turned on or off is determined according to whether the threshold voltage is high or low, that is, whether electrons are injected into the floating gate or not. More specifically, the drain of the floating gate transistor is connected to a bit line which is in turn connected to a power source via a load element. When the threshold voltage is low (when no electron is stored in the floating gate), the floating gate transistor is turned on, causing a current to flow from the power source to the ground via the load element, the bit line and the floating gate transistor. As a result, the bit line is discharged and is set to a low potential level. Assume that data "1" is stored in this case. Then, the memory data "1" is determined by sensing the low potential by means of a sense amplifier. On the other hand, when the threshold voltage is high (when electrons are injected into the floating gate), the floating gate transistor is kept in the off condition, the bit line is charged by means of the power source via the load element and is set to a high potential level. The high potential is sensed by the sense amplifier and storage of data "0" is determined.

A method of injecting electrons into the floating gate 104 is effected by applying a high voltage between the control gate 106 and the drain 102 of the floating gate transistor to generate hot electrons and inject the hot electrons into the floating gate 104.

A method of emitting electrons is effected by applying 0 V to the control gate of the floating gate transistor and applying a high voltage to the drain 102 so as to emit the electrons from the floating gate 104 to the drain 102 by use of the tunnel effect of the first insulation film 103.

Injection of electrons into the floating gate 104 and emission of electrons from the floating gate 104 are effected by using the above two methods and thus data can be electrically programmed and erased in the memory cell of FIG. 1.

FIG. 2 shows a memory cell array constituted by use of memory cells of the structure shown in FIG. 1 and a peripheral circuit thereof. Memory cells MC11, MC12, MC13, ---, MC21, MC22, MC23, ---, MC31, MC32, MC33, --- are arranged in a matrix form. The control gates of the memory cells MC on the same row are connected to a corresponding one of word lines WL1, WL2, WL3, ---, the drains of the memory cells MC on the same column are connected to a corresponding one of bit lines BL1, BL2, BL3, --- and each of the sources of the memory cells MC is grounded. Outputs of a row decoder RD are supplied to the word lines WL1, WL2, WL3, --- and outputs of a column decoder CD are supplied to the bit lines BL1, BL2, BL3, ---.

In a case where the memory data of the memory cell MC is electrically erased, a plurality of floating gate transistors MC which are arranged on the same column (which are connected to the same bit line BL) are used as one unit. That is, the memory data of the floating gate transistors MC which are arranged on the same column are electrically erased at the same time. For example, the memory data of the memory cells MC21, MC22, MC23, --- are erased at the same time by setting all the word lines WL1, WL2, WL3, -- to 0 V and applying a high voltage to the bit line BL2.

In the conventional EPROM as described above, the operation of extracting electrons is effected with respect to the memory cells MC on the same column. Therefore, if the amounts of electrons stored in the floating gates 104 of the memory cells MC connected to the same bit line are different, it becomes necessary to continuously apply a high voltage to the bit line until all the electrons are extracted from the floating gate which has the largest amount of electrons stored therein. For this reason, electrons may be excessively extracted from the floating gate 104 of the memory cell MC which has little electrons stored therein and the floating gate will be positively charged. This is called excessive erasing condition. Assume, for example, that data "1" is stored in the memory cell MC21 and data "0" is stored in the other memory cells MC22, MC23, ---. That is, a sufficiently large amount of electrons are stored in the floating gate 104 of the memory cells MC22, MC23, --- and few electrons are stored in the floating gate 104 of the memory cell MC21. If, in this condition, a high voltage is applied to the bit line BL2 to simultaneously erase the memory data of the memory cells MC21, MC22, MC23, ---, then the memory cell MC21 is set into the excessive erasing condition. When the memory cell MC is set into the excessive erasing condition, then the memory cell is converted into a depletion type and the threshold voltage thereof becomes negative. As a result, a current will flow between the source and drain even when the potential of the control gate 106 or the potential of the word line WL1 is 0 V (ground potential).

Assume now that the memory cell MC21 is set in the excessive erasing condition and the memory cell MC22 is set in the data "0" programmed condition (in which electrons are stored in the floating gate thereof) in the EPROM of FIG. 2. Then, the bit line BL2 is selected by the column decoder CD and supplied with a voltage of 2 V and the other bit lines BL1, BL3, --- are set into an open condition in order to select the memory cell MC22. Further, the word line WL2 is selectively supplied with a voltage of 5 V by means of the row decoder RD and the other word lines WL1, WL3, --- are set to the ground potential, for example, 0 V. Since the memory cell MC22 thus selected has data "0" stored therein, the floating gate transistor is kept turned off and no cell current will flow therein. Therefore, theoretically, the potential of the bit line BL2 does not vary and data "0" may be read out as the result of sensing operation of a sensing amplifier (not shown). However, in a case where the memory cell MC21 which is set in the excessive erasing condition is present on the same bit line BL2, the floating gate transistor of the memory cell MC21 is converted into the depletion type. Therefore, even if the control gate thereof is set at 0 V, a cell current flows, changing the potential of the bit line BL2. The potential change is read by means of the sense amplifier and it is erroneously determined that data "1" is stored in the selected memory cell MC22. That is, an erroneous operation occurs. In order to prevent occurrence of the excessive erasing condition due to the difference in the initially stored data (the presence of memory cells storing data "1" and data "0" on the same column), the programming operation is effected with respect to all the memory cells MC before the erasing operation so as to set all the memory cells MC into the condition in which a sufficiently large amount of electrons are stored (initialization) and then the erasing operation is effected.

Further, if the erasing period of time is too long, an excessive amount of electrons may be extracted from the floating gate and the excessive erasing condition occurs. In order to prevent this occurrence, the erasing verifying method is used in the prior art. In the erasing verifying method, when the memory data is electrically erased, a high voltage in the form of short pulse wave is applied to the drain and data is read out each time the pulse is applied That is, electrons are extracted slowly and the erasing condition is checked after each pulse applying operation so as to prevent occurrence of the excessive erasing condition. However, the erasing operation is extremely complicated and the time for completing the erasing operation becomes long, considerably degrading the function of the semiconductor memory device.

In order to solve the above problems, another method is proposed in which a transistor having no floating gate is arranged adjacent to the floating gate transistor in a lengthwise direction of a channel. For convenience, the transistor having no floating gate is referred to as an offset transistor. The gate of the offset transistor is connected to the same word line to which the control gate of the floating gate transistor is connected.

Now, the memory cell having the offset transistor is explained with reference to FIGS. 3 and 4.

FIG. 3 is a cross sectional view of a memory cell having the offset transistor in which n-type source and drain regions 102 separated by a preset distance from each other are formed in the main surface area of a p-type semiconductor substrate 101. A first insulation film 103 is formed on that portion of the substrate 101 which lies between the source and drain regions 102 and a floating gate 104 formed of a first polysilicon layer is formed on the insulation film 103. A second insulation film 105 is formed on the floating gate 104 and that portion of the substrate 102 which lies between the source and drain regions 102 and on which the insulation film 103 is not formed and a control gate 106 formed of a second polysilicon layer is formed on the insulation film 105. Portion 106A of the control gate 106 acts as a control gate of the floating gate transistor and portion 106B of the control gate 106 acts as a gate of the offset transistor.

With the memory cell of the above construction, since the offset transistor arranged adjacent to the floating gate transistor has no floating gate 104, the offset transistor will not be turned on if the control gate 106 is kept at the ground potential even in a case where the floating gate 104 is set into the excessive erasing condition and the floating gate transistor is converted into the depletion type. As a result, no cell current will flow even if the floating gate 104 is set into the excessive erasing condition and the floating gate transistor is converted into the depletion type.

FIG. 4 shows a memory cell array formed by using the memory cell shown in FIG. 3 and a peripheral circuit thereof. Assume that a memory cell MC21 is set into the excessive erasing condition and a memory cell MC22 is set into the data "0" programmed condition. In order to select the memory cell MC22, a bit line BL2 is selected by a column decoder CD and supplied with a voltage of 2 V and the other bit lines BL1, BL3 --- are set into the open condition. At the same time, a word line WL2 is selected by means of a row decoder RD and supplied with a voltage of 5 V and the other word lines WL1, WL3, --- are set at the ground potential, for example, 0 V. Since the memory cell MC22 thus selected has data "0" stored therein, the floating gate transistor is turned off. Therefore, no cell current flows therein and the potential of the bit line BL2 does not change so that data "0" may be read out as the result of the sensing operation of a sense amplifier (not shown). At this time, the memory cell MC21 which is set into the excessive erasing condition is connected to the bit line BL2. However, the memory cell MC21 has the offset transistor and is kept in the turn-off condition if the control gate thereof is set at the ground potential (0 V). Therefore, the memory cell MC21 set in the excessive erasing condition will not affect the potential of the bit line BL2. As a result, even if a memory cell set in the excessive erasing condition is present on the same bit line to which the selected memory cell MC22 is connected, the memory data can be correctly read out from the memory cell MC22.

However, in the memory cell having the offset transistor, it is necessary to provide an offset transistor forming area in the element formation area since an offset transistor section is formed in each memory cell, thus preventing the miniaturization of the elements.

As described above, the nonvolatile semiconductor memory device having offset transistors, various problems caused by the presence of a memory cell set in the excessive erasing condition can be solved but the miniaturization thereof becomes difficult because of its structure and the integration density cannot be easily enhanced.

SUMMARY OF THE INVENTION

Accordingly, a first object of this invention is to provide a nonvolatile semiconductor memory device which has excellent integration density.

A second object of this invention is to provide a method for manufacturing nonvolatile semiconductor memory devices which have excellent integration density.

The first object of this invention is attained by a nonvolatile semiconductor memory device which comprises a semiconductor substrate of a first conductivity type; source and drain regions of a second conductivity type formed in a stripe form in the main surface area of the semiconductor substrate; a first insulation film for element isolation formed on the source and drain regions of the semiconductor substrate; a second insulation film formed on a portion of the semiconductor substrate which lies between the source and drain regions; a floating gate formed on the second insulation film; a third insulation film formed on the floating gate, the first insulation film and a portion of the semiconductor substrate which lies between the source and drain regions and on which the second insulation film is not formed; a control gate formed in a stripe form on the third insulation film to extend in a direction which intersects the source and drain regions; and an impurity region of the first conductivity type for element isolation having a higher impurity concentration than the semiconductor substrate and formed in the semiconductor substrate except the source and drain regions and the portions lying below the control gate.

With the above construction, the element isolation between the memory cells can be attained by means of the first insulation film and the impurity region of the first conductivity type. Therefore, it is not necessary to pay any attention to the dimensional error due to the presence of the bird's beak or the like which is caused when a thick field oxide film is formed as the element isolation region by the LOCOS method and it is possible to reduce the size of the element regions used for forming the memory cells.

Thus, it becomes possible to provide a nonvolatile semiconductor memory device which has excellent integration density.

The second object of this invention can be attained by a method for manufacturing semiconductor memory devices comprising the steps of forming a first insulation film on a semiconductor substrate of a first conductivity type; forming a first conductive layer on the first insulation film; patterning the first conductive layer and the first insulation film into a stripe form; forming source and drain regions of a second conductivity type in a stripe form by doping impurity of the second conductivity type into the main surface area of the semiconductor substrate with the remaining portions of the first conductive layer and the first insulation film used as a mask; forming a second insulation film on the entire surface of the semiconductor structure; coating first photoresist on the second insulation film; etching the first photoresist and the second insulation film to have the same surface level as the upper surface of the first conductive layer so as to leave portions of the second insulation film between the first conductive layer portions formed in the stripe form; coating second photoresist on the entire surface of the semiconductor structure; patterning the second photoresist; selectively removing portions of the first conductive layer and the first insulation film with the remaining portion of the second photoresist used as a mask so as to expose part of the surface area of the semiconductor substrate; forming a third insulation film on the entire surface of the semiconductor structure; forming a second conductive layer on the third insulation film; patterning the second conductive layer, third insulation film, first conductive layer and first and second insulation films into a stripe form extending in a direction which intersects the source and drain regions formed in the stripe form; and forming an impurity region of the first conductivity type for element isolation by doping impurity of the first conductivity type into the main surface area of the semiconductor substrate with those portions of the second conductive layer, third insulation film, first conductive layer and first and second insulation films which are left behind in the patterning step used as a mask.

According to the above method, since the element isolation is attained without using the LOCOS method, it is not necessary to pay any attention to the dimensional error due to the presence of the bird's beak which may be caused when the LOCOS method is used and it is possible to reduce the size of the element formation region. Further, the element isolation in the lengthwise direction of the channel of the memory cell can be attained by forming the impurity diffusion layer with the high impurity concentration for element isolation by ion-implanting impurity of the same conductivity type as the semiconductor substrate into the semiconductor substrate after the floating gate is formed and then thermally diffusing the ion-implanted impurity. Therefore, the element isolation region can be formed in a self-aligned manner. In this way, it is not necessary to pay attention to the misalignment in the lengthwise direction of the channel of the floating gate, and it is possible to further reduce the size of the element formation region.

Thus, the method for manufacturing nonvolatile semiconductor memory devices which have excellent integration density.

BRIEF DESCRIPTION OF THE DRAWINGS

FIG. 5 is a pattern plan view showing a portion of a memory cell array in a nonvolatile semiconductor memory device according to a first embodiment of this invention;

FIG. 6 is a cross sectional view of the pattern taken along the line A—A' of FIG. 5;

FIG. 7 is a cross sectional view of the pattern taken along the line B—B' of FIG. 5;

FIGS. 8A to 8G are cross sectional views taken along the line A—A' of FIG. 5 and shown in the order of the manufacturing steps to illustrate the process of manufacturing the nonvolatile semiconductor memory device shown in FIGS. 5 to 7;

FIGS. 9A to 9G are cross sectional views taken along the line B—B' of FIG. 5 and shown in the order of the manufacturing steps to illustrate the process of manufacturing the nonvolatile semiconductor memory device shown in FIGS. 5 to 7;

FIGS. 14A to 14H are cross sectional views taken along the line D—D' of FIG. 10 and shown in the order of the manufacturing steps to illustrate the process of manufacturing the nonvolatile semiconductor memory device shown in FIGS. 10 to 12.

DETAILED DESCRIPTION OF THE PREFERRED EMBODIMENTS

Figure 1:
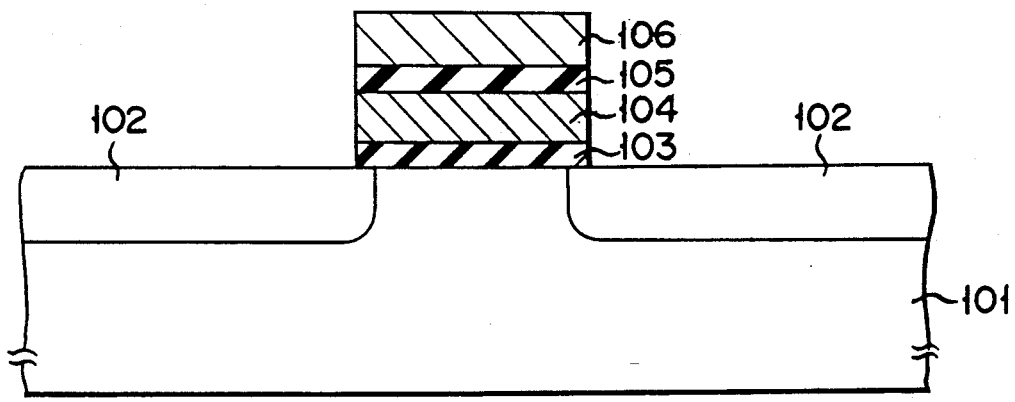
FIG. 1 is a cross sectional view of a memory cell of the conventional nonvolatile semiconductor memory device.
Figure 2:
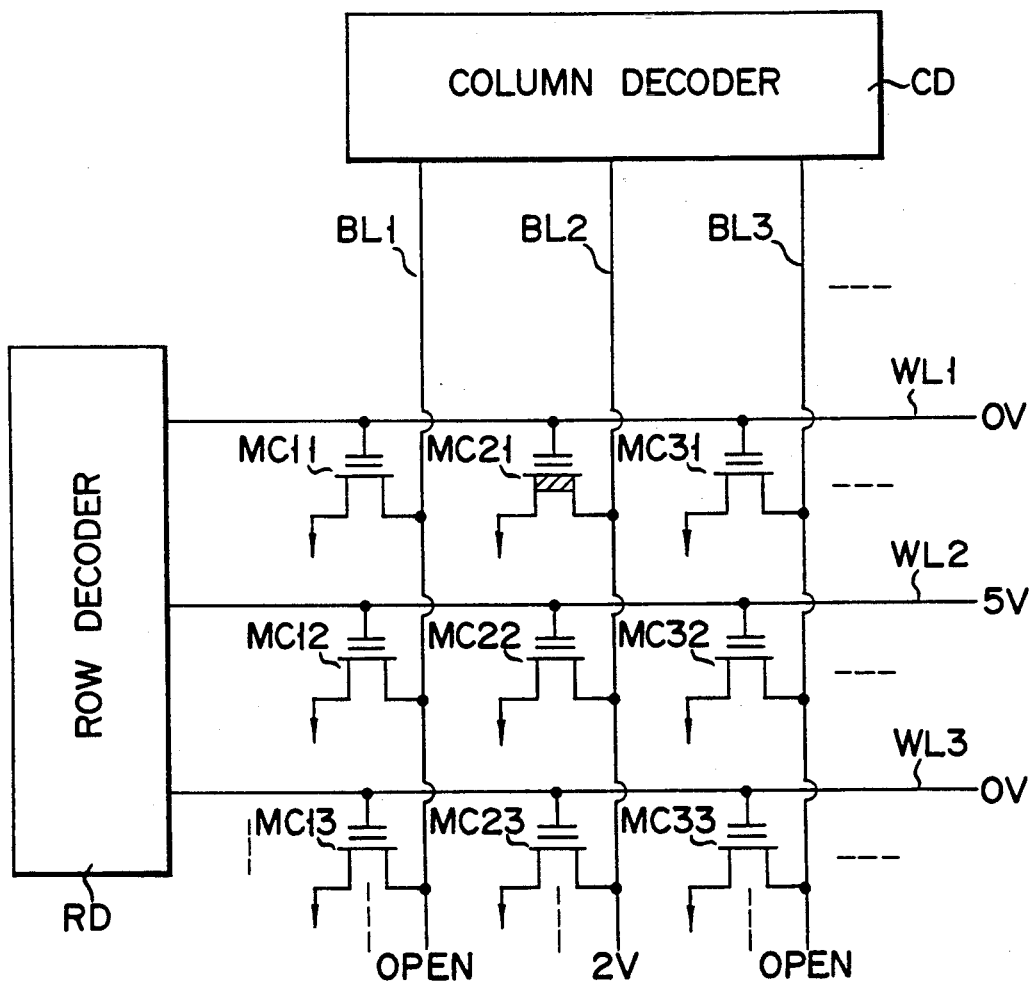
FIG. 2 is a circuit diagram showing a memory cell array constructed by the memory cell shown in FIG. 1 and a peripheral circuit thereof.
Figure 3:
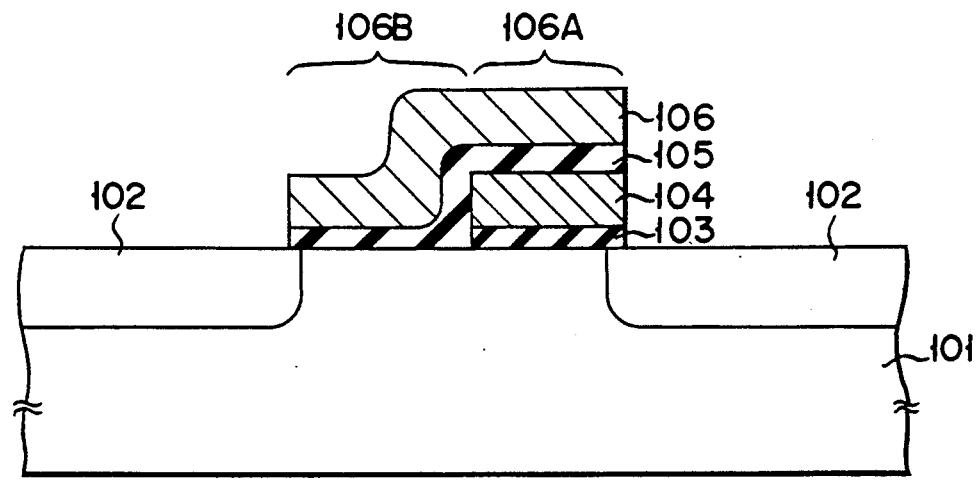
FIG. 3 is a cross sectional view of a memory cell having an offset transistor in an improved conventional nonvolatile semiconductor memory device.
Figure 4:
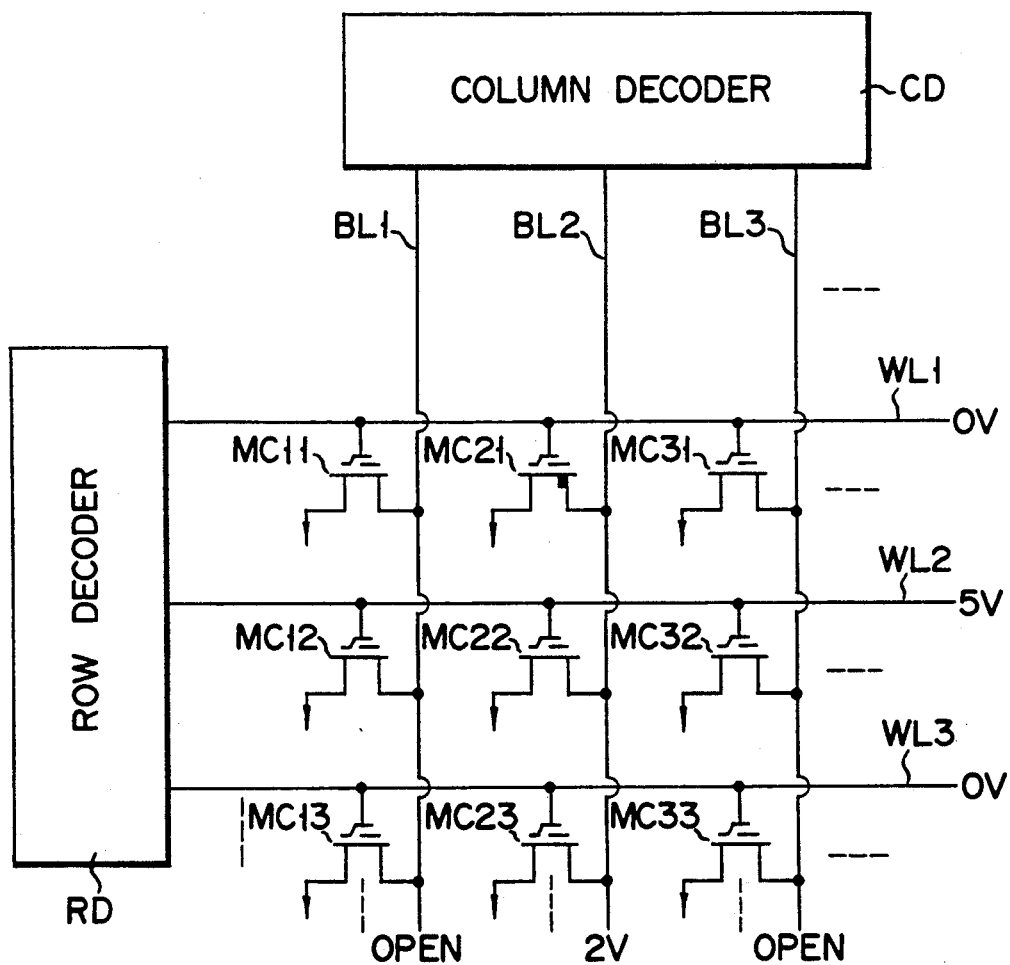
FIG. 4 is a circuit diagram showing a memory cell array constructed by the memory cell shown in FIG. 3 and a peripheral circuit thereof.

FIG. 5 is a pattern plan view showing a portion of a memory cell array in a nonvolatile semiconductor memory device according to a first embodiment of this invention, FIG. 6 is a cross sectional view of the pattern taken along the line A—A' of FIG. 5, and FIG. 7 is a cross sectional view of the pattern taken along the line B—B' of FIG. 5.

As shown in FIG. 5 n+-type source and drain regions 2 of high impurity concentration are formed in a stripe form in the main surface area of a p-type semiconductor substrate 1. Word lines 8 are formed in a stripe form over the substrate 1 to extend in a direction which intersects the source and drain regions 2. Further, p+-type impurity regions 3 having an impurity concentration higher than the substrate 1 for element isolation are formed in the main surface area of the substrate 1, except for those portions of the main surface area in which the source and drain regions 2 are formed and over which the word lines 8 are formed. The element isolation in the width direction of the channel of the floating gate transistor can be attained by means of the p+-type impurity regions 3. An interlayer insulation film is formed by deposition on the entire surface of the memory device of FIG. 5 although not shown, and each element is isolated from the other elements.

Each memory cell has a cross section as shown in FIG. 6. That is, an interlayer insulation film 4 is selectively formed on the source and drain regions 2 of the substrate 1 and a floating gate 6 formed of a first polysilicon layer and a thin insulation film 5 having a tunnel effect are formed on a partial area of the substrate 1 of each element region divided by means of the interlayer insulation film 4 and the p+-type impurity regions 3. A insulation film 7 is formed on the exposed surface of the interlayer insulation film 4, the p+-type impurity regions 3 and the substrate 1. The word lines 8 formed of a second polysilicon layer and acting as control gates are formed on the insulation film 7. The word line 8 functions as the control gate of a floating gate transistor in the element region and at the same time functions as the gate of an offset transistor formed adjacent to the floating gate transistor.

The p+-type impurity regions 3 having an impurity concentration higher than the substrate 1 shown in FIG. 7 are formed in the main surface area of the substrate 1 and the element isolation in the width direction of the channel of the memory cell is attained by means of the p+-type impurity regions 3. One of the source and drain regions 2 is commonly used by the two adjacent memory cells. The insulation film 5, floating gate 6, insulation film 7 and word line 8 acting as the control gate are formed on the substrate 1.

When data is programmed into the nonvolatile semiconductor memory device, a high voltage is applied to both the control gate 8 and the drain region 2 to generate hot electrons and store the electrons into the floating gate 6 of the memory cell. Storage of the electrons causes the potential of the floating gate 6 to be shifted in a negative direction, thereby raising the threshold voltage of the floating gate transistor. As a result, the floating gate transistor will not be turned on when the preset voltage is applied to the control gate. This condition is defined as a condition in which data "0" is stored. On the other hand, when no electron is stored in the floating gate 6, the floating gate transistor is turned on by application of the preset voltage to the control gate. This condition is defined as a condition in which data "1" is stored.

In the data erasing operation, a voltage of 0 V is applied to the control gate and at the same time a high voltage is applied to the drain region 2 to emit the electrons stored in the floating gate 6 to a region (drain region 2) outside the floating gate 6 by using the tunnel effect of the thin oxide film 5. Further, data can be erased by applying ultraviolet rays to the memory device to excite the electrons stored in the floating gate 6, thereby emitting the electrons from the floating gate 6 to an external region.

Now, the manufacturing method of the abovedescribed nonvolatile semiconductor memory device is explained with reference to FIGS. 8A to 8G and FIGS. 9A to 9G.

FIGS. 8A to 8G are cross sectional views of the pattern taken along the line A—A' of FIG. 5 and FIGS. 9A to 9G are cross sectional views of the pattern taken along the line B—B' of FIG. 5. Further, FIGS. 8A to 8G and FIGS. 9A to 9G are shown in the order of the manufacturing steps.

First, p-type impurity of the same conductivity type as the semiconductor substrate 1, for example, boron (B) is ion-implanted into the p-type semiconductor substrate 1 so as to control the threshold voltage. Then, an oxide film 5 is formed to a thickness of, for example, 100 Å on the main surface of the substrate 1 by the thermal oxidation process. The oxide film S is extremely thin and has a tunnel effect. A first polysilicon layer 6 is formed on the oxide film 5 by the CVD method, for example. Then, the first polysilicon layer 6 and the oxide film 5 are selectively and sequentially etched to pattern the same into a stripe form with a photoresist of a predetermined shape (not shown) used as a mask. After this, in order to form source and drain regions, n-type impurity such as arsenic (As) is ion-implanted into the main surface area of the substrate 1 with the first polysilicon layers 6 and the oxide films 5 which are left behind in the stripe form used as a mask. Then, the ion-implanted arsenic is thermally diffused to form n+-type source and drain regions 2 in a stripe form. As a result, the structure as shown in FIGS. 8A and 9A can be obtained.

Next, as shown in FIGS. 8B and 9B, a silicon oxide film 4 is formed on the resultant structure by, for example, the CVD method and then photoresist 9 is coated on the oxide film 4. The photoresist 9 is selected to have an etching rate substantially equal to that of the CVD silicon oxide film 4. Since the photoresist 9 is in a liquid state when coated, the upper surface of the structure can be made substantially flat after the coating.

Next, the photoresist film 9 and the CVD silicon oxide film 4 are removed until they come to the same level as the upper surface of the first polysilicon layers 6 by an anisotropic etching method such as the RIE method. As a result, the CVD silicon oxide films 4 are left behind between the polysilicon layers 6. Then, photoresist 10 is coated on the entire surface of the resultant structure, and the photoresist 10 is exposed to light in a preset mask pattern and developed. The mask alignment effected at this time determines the channel length of the floating gate transistor. In this case, the mask alignment is effected to leave behind the photoresist 10 on part of the CVD silicon oxide film 4 to provide the resultant structures as shown in FIGS. 8C and 9C.

After this, the polysilicon layers 6 and the oxide films 5 are sequentially etched out with the photoresist 10 used as a mask. Then, an oxide film 7 is formed to a thickness of approximately 500 Å on the entire surface of the resultant structure by the thermal oxidation process, for example, to provide the resultant structure as shown in FIGS. 8D and 9D. In this case, a three-layered laminated structure of an oxide film, a nitride film and an oxide film can be used as the oxide film 7.

Then, as shown in FIGS. 8E and 9E, a second polysilicon layer 8 is formed on the entire surface of the resultant structure by the CVD method, for example.

As shown in FIGS. 8F and 9F, the second polysilicon layer 8, oxide film 7, first polysilicon layers 6 and oxide films 5 are sequentially etched out in the same pattern with a photoresist (not shown) used as a mask.

Next, as shown in FIGS. 8G and 9G, p-type impurity having the same conductivity type as the substrate 1, such as boron (B) is ion-implanted into the substrate 1 with the oxide films 4 and the word lines 8 used as a mask and then the ion-implanted ion is thermally diffused to form $p^+$-type impurity regions 3 for element isolation having an impurity concentration higher than the substrate 1. Since, in this case, the interlayer insulation films 4 are formed on the $n^+$-type source and drain regions 2, the ion-implanted boron (B) is interrupted by means of the insulation films 4 and prevented from being injected into the source and drain regions 2.

After this, an interlayer insulation film (not shown) is formed by deposition on the entire surface of the resultant structure and contact holes are formed in predetermined positions of the interlayer insulation film. Then, an aluminum (Al) layer, for example, is formed by vapor deposition on the interlayer insulation film and patterned to form wiring layers. After this, a surface protection film is formed by deposition on the entire surface of the resultant structure, thus completing the nonvolatile semiconductor memory device. In the nonvolatile semiconductor memory device manufactured by the manufacturing method as described above, the element isolation can be attained without using the LOCOS method so that the integration density can be enhanced. That is, the element isolation is attained by effecting the selective oxidation according to the LOCOS method in the prior art, but in this invention, the element isolation can be attained by forming the interlayer insulation films 4 in the stripe form in a direction which intersects at right angles with the word lines 8 and enhancing the impurity concentration of portions of the substrate 1 other than the portions in which the word lines 8 and the interlayer insulation films 4 intersect (that is, forming the impurity regions 3). When the element isolation in the memory cell is effected according to the method as described above, the area of the memory cell region can be determined by a mask used in the photolithographic process for patterning the word lines 8 and a mask used in the photolithographic process for patterning the area of the interlayer insulation film 4 into the stripe form. Therefore, it is not necessary to pay any attention to the dimensional error due to the bird's beak which occurs between the antioxidation film and the oxide film when the LOCOS method is used. Further, since the fringe of the first polysilicon layer in the width direction of the channel is not necessary, the area of the memory cell can be reduced.

Figure 10:
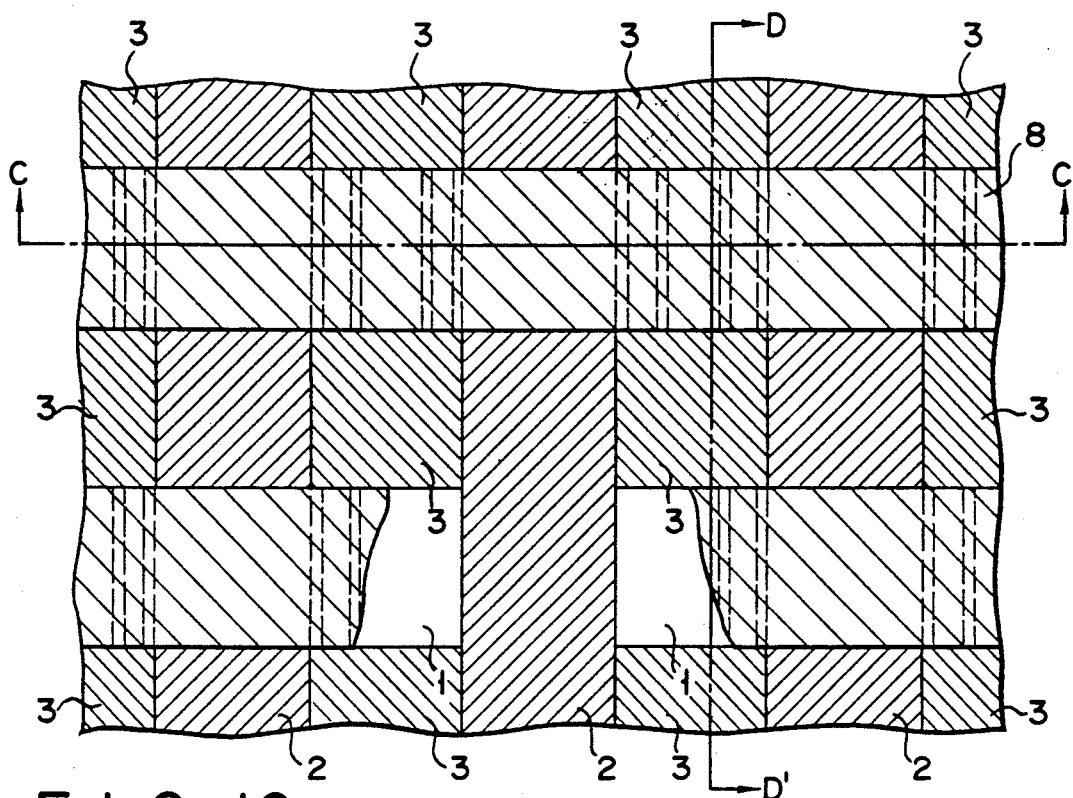
FIG. 10 is a pattern plan view showing a portion of a memory cell array in a nonvolatile semiconductor memory device according to a second embodiment of this invention.
Figure 11:
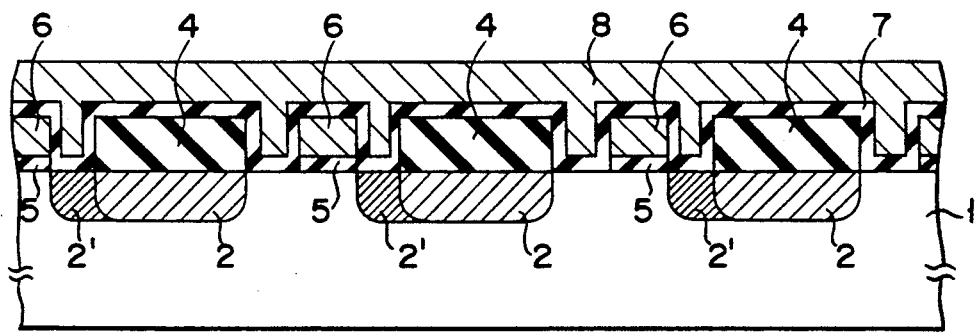
FIG. 11 is a cross sectional view of the pattern taken along the line C—C' of FIG. 10.
Figure 12:
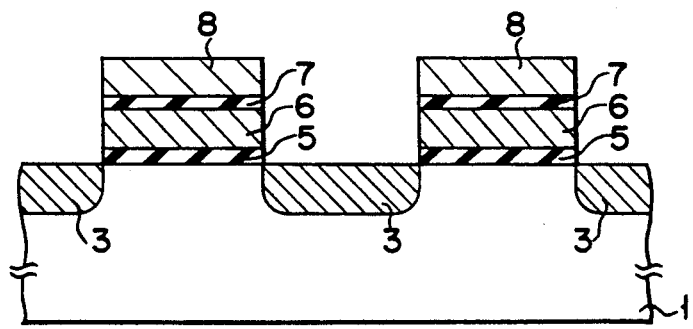
FIG. 12 is a cross sectional view of the pattern taken along the line D—D' of FIG. 10.

FIG. 10 is a pattern plan view showing part of a memory cell array of a nonvolatile semiconductor memory device according to a second embodiment of this invention, FIG. 11 is a cross sectional view of the pattern taken along the line C—C' of FIG. 10 and FIG. 12 is a cross sectional view of the pattern taken along the line D—D' of FIG. 10. In the step shown in FIG. 8C of the first embodiment, the width of the floating gate 6 may vary by the misalignment of the mask used for forming the pattern of the photoresist 10, but in this embodiment, this problem can be solved.

As shown in FIG. 10, $n^+$-type source and drain regions 2 of high impurity concentration are formed in a stripe form in the main surface area of a p-type semiconductor substrate 1. Word lines 8 are formed in a stripe form over the substrate 1 to extend in a direction which intersects the source and drain regions 2. Further, $p^+$-type impurity regions 3 having an impurity concentration higher than the substrate 1 are formed in the main surface area of the substrate 1 except those portions of the main surface area in which the source and drain regions 2 are formed or over which the word lines 8 are formed. The element isolation in the width direction of the channel of the floating gate transistor can be attained by means of the $p^+$-type impurity regions 3. An interlayer insulation film is formed by deposition on the entire surface of the memory device of FIG. 10 although not shown, and each element is isolated from the other element.

Each memory cell has a cross section as shown in FIG. 11. That is, an interlayer insulation film 4 is selectively formed on the source and drain regions 2 of the substrate 1 and a floating gate 6 formed of a first polysilicon layer is formed on a thin insulation film 5 having a tunnel effect which is in turn formed on the element region of each memory cell. The floating gates 6 and the insulation films 5 are formed separately from the interlayer insulation films 4 and impurity regions 2' having the same conductivity type as the source and drain regions 2 and an impurity concentration lower than the source and drain regions 2 are each formed in that portion of the surface area of the substrate 1 which lies on one side of the interlayer insulation film 4 and between the interlayer insulation film 4 and the floating gate 6 or insulation film 5. An insulation film 7 is formed on the floating gates 6, the interlayer insulation films 4, side walls of the films 4 and 6, those portions of the substrate 1 which each lie between the interlayer insulation film 4 and the floating gate 6 or insulation film 5, and on the surfaces of the impurity regions 2'. The word lines 8 formed of a second polysilicon layer and acting as control gates are formed on the insulation film 7. The word line 8 also functions as the gate of an offset transistor.

A mask used for determining the length of the floating gate 6 may be formed with a self-aligned structure so that it can be formed anywhere on the polysilicon layer. Further, since the length of the floating gate 6 can be made constant, variation in the characteristics of the memory cells can be suppressed to a minimum, thus attaining a stable memory cell characteristic. In addition, the word line 8 used as a control gate is formed to cover both side surfaces of the floating gate 6 in those areas which lie between the floating gate 6 and the insulation films 4 on both sides thereof. Therefore, the opposing areas of the control gate 8 and the floating gate 6 can be increased without increasing the area thereof in a plane. As a result, the degree of coupling between the floating gate 6 and the control gate 8 can be increased so that the amount of programming charges can be increased and the cell current in the readout operation can be increased in the memory cell with a small area, thus enhancing the operation margin.

As shown in FIG. 12, the $p^+$-type impurity regions 3 having an impurity concentration higher than the substrate 1 are formed in the main surface area of the substrate 1 and the element isolation in the width direction of the channel of the memory cell is attained by means of the $p^+$-type impurity regions 3. One of the source and drain regions 2 is commonly used by the two adjacent memory cells. The floating gate 6 is formed on the insulation film 5 which is formed on the substrate 1, and the word line 8 acting as the control gate is formed on the insulation film 7 which is formed on the floating gate 6.

When data is programmed into the nonvolatile semiconductor memory device, a high voltage is applied to both the control gate 8 and the drain region 2 to generate hot electrons and store the electrons into the floating gate 6 of the memory cell in the same manner as in the first embodiment. Storage of the electrons causes the potential of the floating gate 6 to be shifted in a negative direction, thereby raising the threshold voltage of the floating gate transistor. As a result, the floating gate transistor will not be turned on when the preset voltage is applied to the control gate. This condition is defined as a condition in which data "0" is stored. On the other hand, when no electron is stored in the floating gate 6, the floating gate transistor is turned on by application of the preset voltage to the control gate. This condition is defined as a condition in which data "1" is stored.

In the data erasing operation, a voltage of 0 V is applied to the control gate and at the same time a high voltage is applied to the drain region 2 to emit the electrons stored in the floating gate 6 to the drain region 2 by using the tunnel effect of the thin oxide film 5.

Now, the manufacturing method of the nonvolatile semiconductor memory device according to the second embodiment is explained with reference to FIGS. 13A to 13H and FIGS. 14A to 14H.

FIGS. 13A to 13H are cross sectional views of the pattern taken along the line C—C' of FIG. 10 and FIGS. 14A to 14H are cross sectional views of the pattern taken along the line D—D' of FIG. 10. Further, FIGS. 13A to 13H and FIGS. 14A to 14H are shown in the order of the manufacturing steps.

Figure 13A:
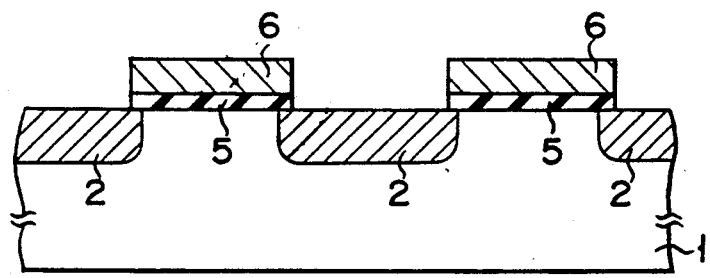
FIGS. 13A to 13H are cross sectional views taken along the line C—C' of FIG. 10 and shown in the order of the manufacturing steps to illustrate the process of manufacturing the nonvolatile semiconductor memory device shown in FIGS. 10 to 12.
Figure 13B:
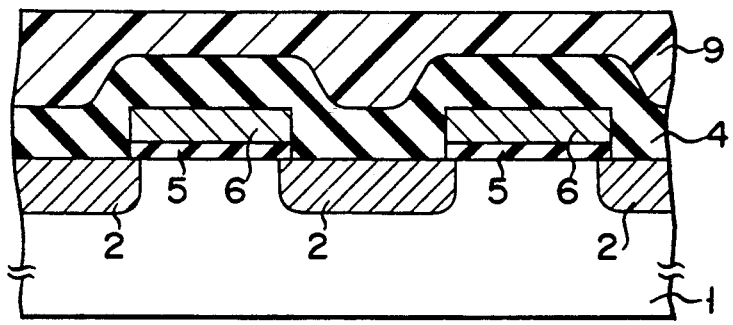

First, p-type impurity, for example, boron (B) is ion-implanted into the p-type semiconductor substrate 1 so as to control the threshold voltage. Then, an oxide film 5 is formed to a thickness of, for example, 100 Å on the entire surface of the substrate 1 by the thermal oxidation process. The oxide film 5 is extremely thin and has a tunnel effect. A first polysilicon layer 6 is formed on the entire surface of the oxide film 5 by the CVD method, for example. Then, the first polysilicon layer 6 and the oxide film 5 are selectively and sequentially etched to pattern the same into a stripe form with a photoresist of a predetermined shape (not shown) used as a mask. After this, n-type impurity such as arsenic (As) is ion-implanted into the main surface area of the substrate 1 with the first polysilicon layers 6 and the oxide films 5 which are left behind used as a mask. Then, the ion-implanted arsenic is thermally diffused to form $n^+$-type source and drain regions 2 in a stripe form. As a result, the structure as shown in FIGS. 13A and 14A can be obtained.

Next, as shown in FIGS. 14B and 14B, a silicon oxide film 4 is formed on the resultant structure by, for example, the CVD method and then photoresist 9 is coated on the oxide film 4. The photoresist 9 is selected to have an etching rate substantially equal to that of the CVD silicon oxide film 4.

Figure 13C:
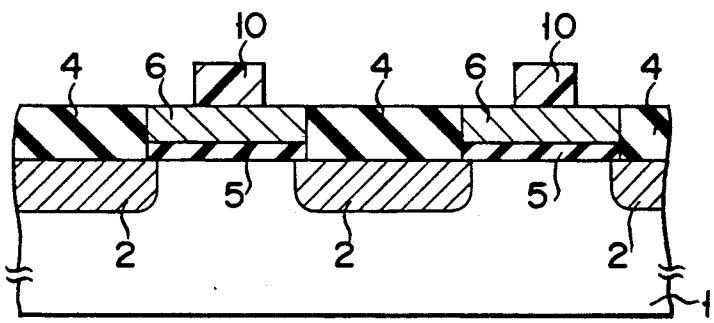
Figure 13D:
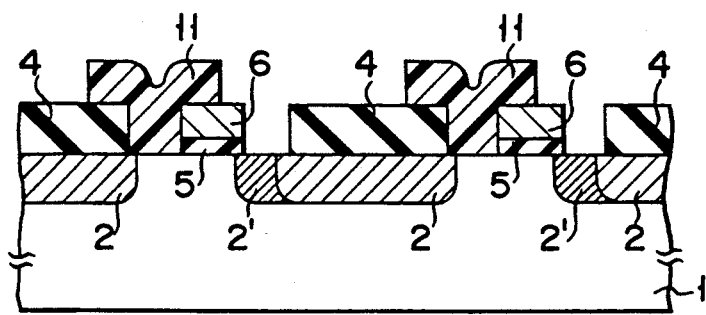

Next, the photoresist film 9 and the CVD silicon oxide film 4 are removed until they come to the same level as the upper surface of the first polysilicon layers 6 by an anisotropic etching method such as the RIE method. As a result, the CVD silicon oxide films 4 are left behind between the polysilicon layers 6 as shown in FIGS. 13C and 14C. Then, photoresist 10 is coated on the entire surface of the resultant structure, and the photoresist 10 is exposed to light and developed to form a resist pattern. The mask alignment effected at this time determines the channel length of the floating gate transistor. In this case, the mask alignment is effected to leave the photoresist 10 behind only on the upper central area of the polysilicon layer 6.

After this, the polysilicon layers 6 and the oxide films 5 are sequentially etched out with the photoresist 10 used as a mask. As a result, the floating gates 6 formed separately from the interlayer insulation films 4 and the thin oxide films 5 lying under the floating gates 6 are left behind. Then, photoresist patterns 11 are each formed to cover one of the space areas between each interlayer insulation film 4 and the polysilicon layers 6 or oxide films 5 lying on both sides of the interlayer insulation film 4. Further, for example, arsenic (As) is ion-implanted into the surface area of the substrate 1 corresponding to the other space area and thermally diffused to form n-type impurity regions 2' in contact with one side surfaces of the respective source and drain regions 2 (refer to FIGS. 13D and 14D). The n-type impurity region 2' functions to prevent offset transistors from being formed on both sides of each floating gate 6.

Figure 13E:
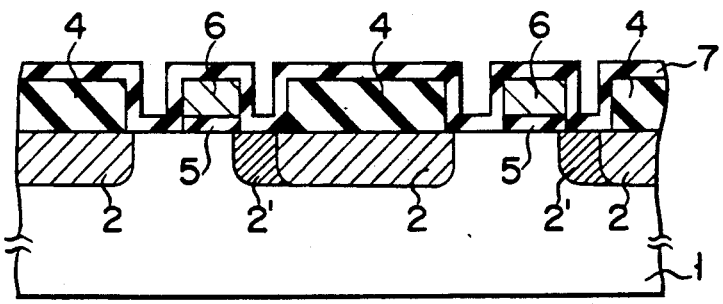
Figure 14E:
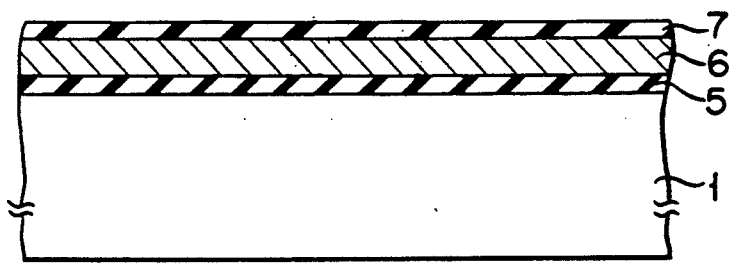

Then, as shown in FIGS. 13E and 14E, an oxide film 7 is formed to a thickness of approximately 500 Å on the entire surface of the resultant structure by the thermal oxidation process. In this case, a three-layered laminated structure of an oxide film, a nitride film and an oxide film can be used as the oxide film 7.

Figure 13F:
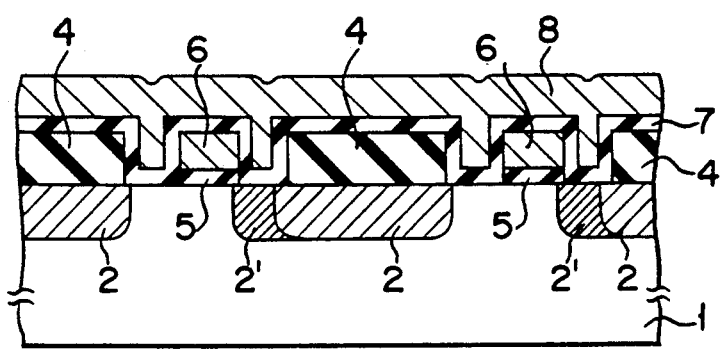
Figure 14F:
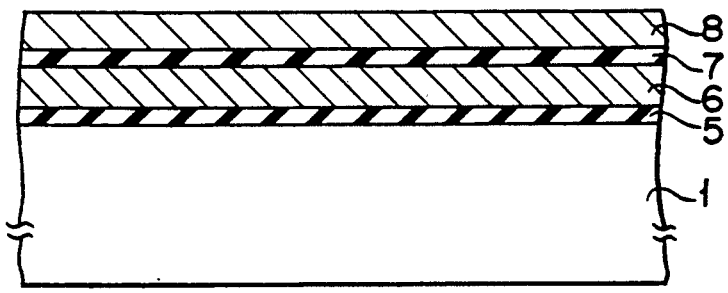

Then, as shown in FIGS. 13F and 14F, a second polysilicon layer 8 is formed on the entire surface of the resultant structure by the CVD method, for example.

Figure 13G:
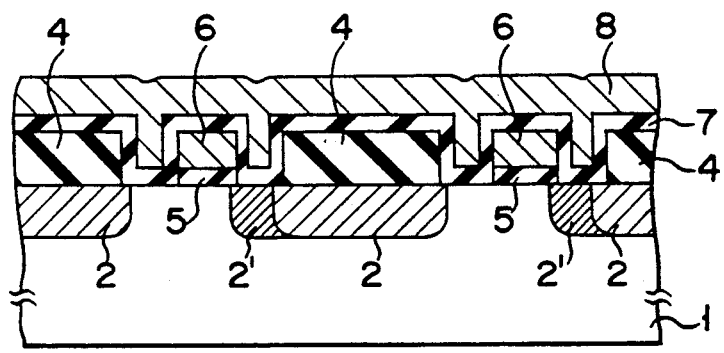
Figure 14G:
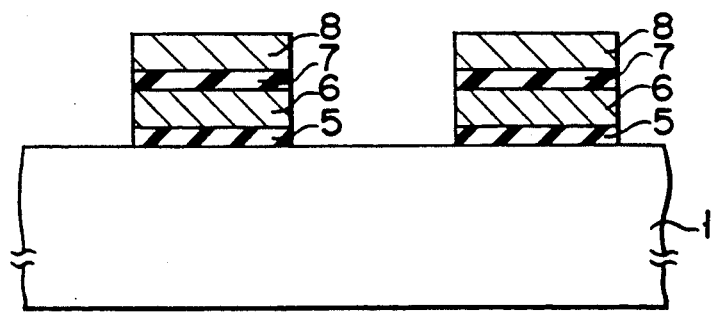

After this, the second polysilicon layer 8, oxide film 7, first polysilicon layers 6 and oxide films 5 and 4 are sequentially etched out in a stripe form extending in a direction which intersects the source and drain regions 2 of the stripe form with a photoresist pattern used as a mask. Then, the resultant structure as shown in FIGS. 13G and 14G can be obtained.

Figure 13H:
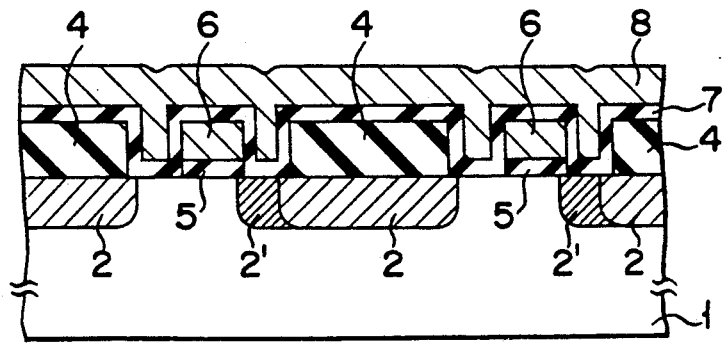
Figure 14H:
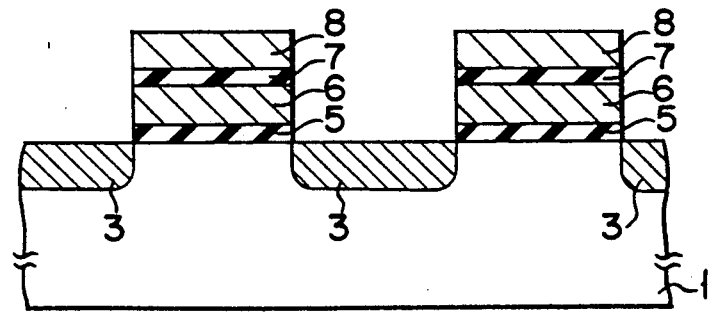

Next, for example, boron (B) is ion-implanted into the substrate 1 with the oxide films 4 and the word lines 8 used as a mask and then the ion-implanted ion is thermally diffused to form $p^+$-type impurity regions for element isolation having an impurity concentration higher than the substrate 1 (refer to FIGS. 13H and 14H). After this, an interlayer insulation film (not shown) is formed by deposition on the entire surface of the resultant structure and contact holes are formed in predetermined positions of the interlayer insulation film. Then, an aluminum (Al) layer, for example, is formed by vapor deposition on the interlayer insulation film and patterned to form wiring layers. After this, a surface protection film is formed by deposition on the entire surface of the resultant structure, thus completing the nonvolatile semiconductor memory device.

According to the above manufacturing method, in addition to the effect obtained in the first embodiment, the following effect can be obtained. That is, in this embodiment, the floating gate 6 is formed separately from the insulation film 4 and therefore it becomes possible to make the length of the floating gate constant irrespective of the mask misalignment of the photoresist film 10 in the step of FIG. 8C. Further, since both side surfaces of the floating gate 6 are covered with the word line 8 acting as the control gate, the degree of coupling between the control gate 8 and the floating gate 6 can be enhanced. As a result, the programming charge amount and the cell current in the readout mode can be increased, thereby enhancing the operation margin.

As described above, according to this invention, the element isolation between the memory cells can be attained without using the LOCOS method. Therefore, it is not necessary to pay any attention to the dimensional error caused by the presence of the bird's beak and the size of the element region of the memory cell can be reduced, thus enhancing the integration density of the memory device. Further, since the offset transistor is formed in the memory cell, the memory device will not be erroneously operated even when a memory cell from which electrons are excessively extracted in the electrically erasing operation is present. The memory device is simple in construction and the operation speed thereof is high. In this way, a nonvolatile semiconductor memory device in which the integration density can be enhanced without losing the advantage obtained by using the offset transistor and a method for manufacturing the same can be provided.

What is claimed is:

1. A nonvolatile semiconductor memory device comprising:
   a semiconductor substrate of a first conductivity type;
   a plurality of memory cells, each memory cell including:
   source and drain regions of a second conductivity type formed in a stripe form in a part of a main surface area of said semiconductor substrate,
   a first insulation film for element isolation, formed on said source and drain regions of said semiconductor substrate,
   a second insulation film formed separately from said first insulation film and on a portion of said semiconductor substrate which lies between said source and drain regions,
   a floating gate formed on said second insulation film,
   an impurity region of the second conductivity type formed in contact with one of said source and drain regions in that portion of the main surface area of said semiconductor substrate which lies between said floating gate and said first insulation film,
   a third insulation film formed on said floating gate, on said first insulation film, and on a portion of said semiconductor substrate which is located between said source and drain regions other than that portion of said semiconductor substrate on which said second insulation film is formed,
   a control gate formed in a stripe form on said third insulation film to extend in a direction which intersects said source and drain regions,
   said control gate having a first region located over a region between said source and drain regions, and opposing the main surface area of said semiconductor substrate, said third insulation film being positioned between said semiconductor substrate and said first region,
   said control gate further having a second region located over a region between said source and said drain regions, and opposing said impurity region of the second conductivity type formed in the main surface area of said semiconductor substrate, said third insulation film being positioned between said impurity region of the second conductivity type and said second region,
   said control gate further having a third region located over a region between said source and drain regions, and provided between said first region and said second region and opposing the main surface of said semiconductor substrate, said third insulation film, said floating gate, and said first insulation film being positioned between said semiconductor substrate and said third region,
   said control gate having a first portion located below said third region to form a memory cell, a second portion located below said first region to form an offset transistor, and a third portion located below said second region of said control gate,
   said impurity region of the second conductivity type including means for preventing formation of a parasitic transistor in said third portion of said control gate, and
   an impurity region of the first conductivity type for element isolation having a higher impurity concentration than said semiconductor substrate and formed in the main surface area of said semiconductor substrate, except for that part of the main surface area in which said source and drain regions are formed, and except for a part of the main surface area above which said control gate is formed;
   the spacing between the source and drain regions of different memory cells being substantially identical;
   the width of the first region of said control gate being different for different memory cells;
   the sum of the width of the first region of said control gate and the width of said second region of said control gate being substantially identical for different cells; and
   whereby the width of the floating gate of different memory cells is substantially identical.

2. A device according to claim 1, wherein one of said source and drain regions is commonly used by adjacent memory cells.

3. A device according to claim 1, wherein said second insulation film is a thin insulation film having a tunnel effect.

4. A device according to claim 1, wherein each of said floating gate and control gate includes a polysilicon layer.

5. A nonvolatile semiconductor memory device comprising:
- a semiconductor substrate of a first conductivity type;
- source and drain regions of a second conductivity type formed in a stripe form in a part of a main surface area of said semiconductor substrate;
- a plurality of memory cells, each memory cell including:
- a first insulation film for element isolation, formed on said source and drain regions of said semiconductor substrate,
- a second insulation film formed separately from said first insulation film and on a portion of said semiconductor substrate which lies between said source and drain regions,
- a floating gate formed on said second insulation film,
- means for preventing an offset transistor from being formed on a side of the floating gate, the offset transistor preventing means including an impurity region of the second conductivity type having a lower impurity concentration than said source and drain regions and formed in contact with one of said source and drain regions in that portion of the surface area of said semiconductor substrate which lies between said floating gate and said first insulation film,
- a third insulation film formed on said floating gate, on said first insulation film, and on a portion of said semiconductor substrate which is located between said source and drain regions other than that portion of said semiconductor substrate on which said second insulation film is formed,
- a control gate formed in a stripe form on said third insulation film to extend in a direction which intersects said source and drain regions,
- said control gate having a first region located over a region between said source and drain regions, and opposing the main surface area of said semiconductor substrate, said third insulation film being positioned between said semiconductor substrate and said first region,
- said control gate further having a second region located over a region between said source and said drain regions, and opposing said impurity region of the second conductivity type formed in the main surface area of said semiconductor substrate, said third insulation film being positioned between said impurity region of the second conductivity type and said second region,
- said control gate further having a third region located over a region between said source and drain regions, and provided between said first region and said second region and opposing the main surface of said semiconductor substrate, said third insulation film, said floating gate, and said first insulation film being positioned between said semiconductor substrate and said third region,
- said control gate having a first region located below said third region to form a memory cell, and a second portion located below said first region to form an offset transistor, and
- an impurity region of the first conductivity type for element isolation formed in the main surface area of said semiconductor substrate, except for that part of the main surface area in which said source and drain regions are formed, and except for a part of the main surface area above which said control gate is formed;
- the width of the first region of said control gate being different for different memory cells;
- the sum of the width of the first region of said control gate and the width of said second region of said control gate being substantially identical for different cells; and
- whereby the width of the floating gate of different memory cells is substantially identical.

* * * * *